(12) United States Patent
Yang et al.

(10) Patent No.: US 10,096,487 B2
(45) Date of Patent: Oct. 9, 2018

(54) ATOMIC LAYER ETCHING OF TUNGSTEN AND OTHER METALS

(71) Applicant: Lam Research Corporation, Fremont, CA (US)

(72) Inventors: Wenbing Yang, Fremont, CA (US); Samantha Tan, Fremont, CA (US); Keren Jacobs Kanarik, Los Altos, CA (US); Jeffrey Marks, Saratoga, CA (US); Taeseung Kim, Fremont, CA (US); Meihua Shen, Fremont, CA (US); Thorsten Lill, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/239,138

(22) Filed: Aug. 17, 2016

(65) Prior Publication Data

US 2017/0053810 A1    Feb. 23, 2017

Related U.S. Application Data

(60) Provisional application No. 62/207,250, filed on Aug. 19, 2015.

(51) Int. Cl.
*H01L 21/302* (2006.01)
*H01L 21/461* (2006.01)
(Continued)

(52) U.S. Cl.
CPC .......... *H01L 21/32136* (2013.01); *C23F 4/00* (2013.01); *H01J 37/32009* (2013.01);
(Continued)

(58) Field of Classification Search
None
See application file for complete search history.

(56) References Cited

U.S. PATENT DOCUMENTS

| | | |
|---|---|---|
| 4,592,801 A | 6/1986 | Hara et al. |
| 5,482,802 A | 1/1996 | Celler et al. |

(Continued)

FOREIGN PATENT DOCUMENTS

| | | |
|---|---|---|
| CN | 1550575 | 12/2004 |
| CN | 1552097 A | 12/2004 |

(Continued)

OTHER PUBLICATIONS

U.S. Final Office Action dated Sep. 23, 2016 issued in U.S. Appl. No. 14/749,285.

(Continued)

*Primary Examiner* — Stephanie P Duclair
(74) *Attorney, Agent, or Firm* — Weaver Austin Villeneuve & Sampson LLP (57) ABSTRACT

Provided herein are methods of atomic layer etching (ALE) of metals including tungsten (W) and cobalt (Co). The methods disclosed herein provide precise etch control down to the atomic level, with etching a low as 1 Å to 10 Å per cycle in some embodiments. In some embodiments, directional control is provided without damage to the surface of interest. The methods may include cycles of a modification operation to form a reactive layer, followed by a removal operation to etch only this modified layer. The modification is performed without spontaneously etching the surface of the metal.

16 Claims, 7 Drawing Sheets

(51) Int. Cl.
| | |
|---|---|
| B44C 1/22 | (2006.01) |
| C03C 15/00 | (2006.01) |
| C03C 25/68 | (2006.01) |
| C23F 1/00 | (2006.01) |
| H01L 21/3213 | (2006.01) |
| H01L 21/67 | (2006.01) |
| H01J 37/32 | (2006.01) |
| C23F 4/00 | (2006.01) |

(52) U.S. Cl.
CPC .... *H01J 37/3244* (2013.01); *H01J 37/32082* (2013.01); *H01J 37/32192* (2013.01); *H01J 37/32449* (2013.01); *H01J 37/32715* (2013.01); *H01J 37/32724* (2013.01); *H01L 21/67069* (2013.01); *H01J 2237/334* (2013.01); *Y10S 148/042* (2013.01); *Y10S 438/924* (2013.01)

(56) References Cited

U.S. PATENT DOCUMENTS

| | | | |
|---|---|---|---|
| 5,501,893 | A | 3/1996 | Laermer et al. |
| 5,527,425 | A | 6/1996 | Hobson et al. |
| 5,789,265 | A | 8/1998 | Nitta et al. |
| 5,814,239 | A | 9/1998 | Kaneko et al. |
| 6,022,806 | A | 2/2000 | Sato et al. |
| 6,177,353 | B1 | 1/2001 | Gutsche et al. |
| 6,448,192 | B1 | 9/2002 | Kaushik |
| 6,482,745 | B1 | 11/2002 | Hwang |
| 6,635,965 | B1 | 10/2003 | Lee et al. |
| 6,844,258 | B1 | 1/2005 | Fair et al. |
| 6,933,242 | B1 | 8/2005 | Srinivasan et al. |
| 7,005,372 | B2 | 2/2006 | Levy et al. |
| 7,141,494 | B2 | 11/2006 | Lee et al. |
| 7,196,955 | B2 | 3/2007 | Nickel |
| 7,416,989 | B1 | 8/2008 | Liu et al. |
| 7,589,017 | B2 | 9/2009 | Chan et al. |
| 7,772,114 | B2 | 8/2010 | Chan et al. |
| 7,795,148 | B2 | 9/2010 | Brown |
| 7,955,972 | B2 | 6/2011 | Chan et al. |
| 8,048,805 | B2 | 11/2011 | Chan et al. |
| 8,058,170 | B2 | 11/2011 | Chandrashekar et al. |
| 8,124,505 | B1 | 2/2012 | Burnham et al. |
| 8,124,531 | B2 | 2/2012 | Chandrashekar et al. |
| 8,252,194 | B2 | 8/2012 | Kiehlbauch et al. |
| 8,551,885 | B2 | 10/2013 | Chan et al. |
| 8,808,561 | B2 | 8/2014 | Kanarik |
| 8,883,028 | B2 | 11/2014 | Kanarik |
| 8,993,352 | B2 | 3/2015 | Nishimura et al. |
| 9,130,158 | B1 | 9/2015 | Shen et al. |
| 9,230,818 | B2 | 1/2016 | Moustakas et al. |
| 9,257,638 | B2 | 2/2016 | Tan et al. |
| 9,362,163 | B2 | 6/2016 | Danek et al. |
| 9,378,970 | B2 | 6/2016 | Joubert et al. |
| 9,449,843 | B1 | 9/2016 | Korolik et al. |
| 9,570,317 | B2 | 2/2017 | Posseme et al. |
| 9,570,600 | B2 | 2/2017 | Lu et al. |
| 9,576,811 | B2 | 2/2017 | Kanarik et al. |
| 9,805,941 | B2 | 10/2017 | Kanarik et al. |
| 9,806,252 | B2 | 10/2017 | Tan et al. |
| 9,837,312 | B1 | 12/2017 | Tan et al. |
| 9,870,899 | B2 | 1/2018 | Yang et al. |
| 9,972,504 | B2 | 5/2018 | Yang et al. |
| 9,991,128 | B2 | 6/2018 | Tan et al. |
| 2001/0053585 | A1 | 12/2001 | Kikuchi et al. |
| 2002/0009883 | A1 | 1/2002 | Ogure et al. |
| 2002/0058409 | A1 | 5/2002 | Lin et al. |
| 2002/0081381 | A1 | 6/2002 | DelaRosa et al. |
| 2003/0015704 | A1 | 1/2003 | Curless |
| 2004/0004056 | A1 | 1/2004 | Sasaki et al. |
| 2004/0137749 | A1 | 7/2004 | Ying et al. |
| 2004/0209476 | A1 | 10/2004 | Ying et al. |
| 2004/0222185 | A1 | 11/2004 | Kawai |
| 2005/0006222 | A1 | 1/2005 | Ding et al. |
| 2005/0098440 | A1 | 5/2005 | Kailasam et al. |
| 2006/0009040 | A1 | 1/2006 | Tomioka et al. |
| 2006/0051959 | A1 | 3/2006 | Iwatake et al. |
| 2006/0194435 | A1 | 8/2006 | Nishimura et al. |
| 2007/0049036 | A1 | 3/2007 | Huang |
| 2007/0202254 | A1 | 8/2007 | Ganguli et al. |
| 2007/0238301 | A1 | 10/2007 | Cabral et al. |
| 2007/0246442 | A1 | 10/2007 | America et al. |
| 2009/0020884 | A1 | 1/2009 | Lee et al. |
| 2009/0226611 | A1 | 9/2009 | Suzuki et al. |
| 2009/0236693 | A1 | 9/2009 | Moustakas et al. |
| 2009/0256220 | A1 | 10/2009 | Horng et al. |
| 2009/0289263 | A1 | 11/2009 | Duong et al. |
| 2010/0291751 | A1 | 11/2010 | Lee et al. |
| 2011/0139748 | A1* | 6/2011 | Donnelly .......... H01J 37/32036 216/37 |
| 2011/0151635 | A1 | 6/2011 | Liu et al. |
| 2011/0192820 | A1 | 8/2011 | Yeom et al. |
| 2011/0212274 | A1 | 9/2011 | Selsley |
| 2012/0009785 | A1 | 1/2012 | Chandrashekar et al. |
| 2012/0115329 | A1 | 5/2012 | Chandrashekar et al. |
| 2012/0276657 | A1 | 11/2012 | Joubert et al. |
| 2013/0099277 | A1 | 4/2013 | Speck et al. |
| 2013/0105303 | A1 | 5/2013 | Lubomirsky et al. |
| 2013/0168354 | A1 | 7/2013 | Kanarik |
| 2013/0200391 | A1 | 8/2013 | Bedair et al. |
| 2013/0313561 | A1 | 11/2013 | Suh |
| 2014/0061861 | A1 | 3/2014 | Moustakas et al. |
| 2014/0335666 | A1 | 11/2014 | Koehler et al. |
| 2015/0037972 | A1 | 2/2015 | Danek et al. |
| 2015/0214474 | A1 | 7/2015 | Nishimura et al. |
| 2015/0228495 | A1 | 8/2015 | Joubert et al. |
| 2015/0270140 | A1 | 9/2015 | Gupta et al. |
| 2016/0013063 | A1 | 1/2016 | Ranjan et al. |
| 2016/0020152 | A1 | 1/2016 | Posseme |
| 2016/0064244 | A1 | 3/2016 | Agarwal et al. |
| 2016/0203995 | A1 | 7/2016 | Kanarik et al. |
| 2016/0293437 | A1 | 10/2016 | Zhou et al. |
| 2016/0308112 | A1 | 10/2016 | Tan et al. |
| 2016/0314985 | A1 | 10/2016 | Yang et al. |
| 2016/0358782 | A1 | 12/2016 | Yang et al. |
| 2017/0040214 | A1 | 2/2017 | Lai et al. |
| 2017/0053810 | A1 | 2/2017 | Yang et al. |
| 2017/0069462 | A1 | 3/2017 | Kanarik et al. |
| 2017/0117159 | A1 | 4/2017 | Kanarik et al. |
| 2017/0229311 | A1 | 8/2017 | Tan et al. |
| 2018/0019387 | A1 | 1/2018 | Tan et al. |
| 2018/0033635 | A1 | 2/2018 | Kanarik et al. |
| 2018/0102236 | A1 | 4/2018 | Yang et al. |
| 2018/0174860 | A1 | 6/2018 | Kanarik |

FOREIGN PATENT DOCUMENTS

| | | |
|---|---|---|
| JP | 06326060 | 11/1994 |
| JP | 5416280 B2 | 11/2013 |
| WO | WO 02/091461 A2 | 11/2002 |
| WO | WO 2011/081921 A2 | 7/2011 |
| WO | WO 2016/100873 | 6/2016 |

OTHER PUBLICATIONS

U.S. Office Action dated Feb. 17, 2017 issued in U.S. Appl. No. 14/749,285.

U.S. Final Office Action dated Mar. 30, 2017 issued in U.S. Appl. No. 14/749,285.

U.S. Office Action dated Nov. 28, 2016 issued in U.S. Appl. No. 14/749,291.

U.S. Notice of Allowance dated Jun. 30, 2017 issued in U.S. Appl. No. 14/749,291.

U.S. Final Office Action dated Feb. 7, 2017 issued in U.S. Appl. No. 14/830,683.

U.S. Office Action dated Jul. 25, 2017 issued in U.S. Appl. No. 14/830,683.

Faraz et al., (Mar. 24, 2015) "Atomic Layer Etching: What Can We Learn from Atomic Layer Deposition?," ECS Journal of Solid State Science and Technology, 4(6):N5023-N5032.

(56) References Cited

OTHER PUBLICATIONS

Kanarik et al. (2017) "Predicting synergy in atomic layer etching," *J. Vac. Sci. Technol.* A,35(5):05C302-1 through 05C302-7.
U.S. Appl. No. 15/421,189, filed Jan. 31, 2017, Tan et al.
U.S. Office Action dated Mar. 24, 2017 issued in U.S. Appl. No. 15/286,421.
U.S. Appl. No. 14/749,285, filed Jun. 24, 2015, entitled "Cobalt Etch Back."
U.S. Appl. No. 14/749,291, filed Jun. 24, 2015, entitled "Dry Plasma Etch Method to Pattern MRAM Stack."
U.S. Appl. No. 14/325,190, filed Jul. 7, 2014, entitled "Method to Etch Non-Volatile Metal Materials."
U.S. Patent Application entitled, "Atomic Layer Etching of Tungsten for Enhanced Tungsten Deposition Fill," U.S. Appl. No. 14/830,683, filed Aug. 29, 2015.
U.S. Office Action dated May 5, 2016 issued in U.S. Appl. No. 14/749,285.
U.S. Office Action dated Jul. 1, 2016 issued in U.S. Appl. No. 14/830,683.
Boullart et al. (Mar. 29, 2013) "STT MRAM patterning challenges," *Proc. SPIE, Advanced Etch Technology for Nanopatterning II, Proc. of SPIE* 8685:86850F-1-86850F-9 [Retrieved on Jun. 2, 2015 from http://proceedings.spiedigitallibrary.org].
Carver et al. (Feb. 20, 2015) "Atomic Layer Etching: An Industry Perspective," *ECS Journal of Solid State Science and Technology*, 4(6):N5005-N5009.
Ditizio, Robert and Werbaneth, Paul, Tegal Corporation and Zhu, Jian-Gang, Carnegie Mellon University (Jan. 2004) "Cell Shape and Patterning Considerations for Magnetic Random Access Memory (MRAM) Fabrication," Reprinted with permission from *Semiconductor Manufacturing Magazine*, 7 pp.
Jiang et al. (1998) "Complexes Containing Unbridged Dative Metal-Metal Bonds and the Strong Acceptor $Ru(CO)_3(SiCl_3)_2$ Moiety. Comments on the Transition Metal to Silicon Bond," *Organometallics*, 17(26):5810-5819.
Lee et al. (2015) "Atomic Layer Etching of $Al_2O_3$ Using Sequential, Self-Limiting Thermal Reactions with $Sn(acac)_2$ and Hydrogen Fluoride," $^{ACS}NANO$,9(2):2061-2070.
Pomeroy, R.K. and Wijesekera, K.S. (1980) "Preparation and derivatives of $cis-M(CO)_4(SiCl_3)_2$ (M=Fe, Ru, Os)," *Inorg. Chem.*, 19(12):3729-3735.
Schmitt et al. (2006) "Synthesis and Properties of Single-Crystal FeSi Nanowires," *Nano Lett.*, 6(8):1617-1621.
Schmitt et al. (Feb. 1, 2008) "Chemical Synthesis and Magnetotransport of Magnetic Semiconducting $Fe_{1-x}Co_xSi$ Alloy Nanowires," *Nano Lett.*, 8(3):810-815.
Wolf, S. and Tauber, R.N. (1986) "Silicon Processing for the VLSI Era," *vol. 1—Process Technology, Lattice Press*, pp. 542-557.
U.S. Office Action dated Aug. 11, 2017 issued in U.S. Appl. No. 14/749,285.
U.S. Notice of Allowance dated Sep. 29, 2017 issued in U.S. Appl. No. 14/749,285.
Safranek, Berkenkotter, and Stephens, (1990) "Electroless Cobalt and Cobalt Alloys," Electroless Plating, William Andrew Publishing, Chapter 18, Section 1:pp. 463-480 and Section 2:pp. 481-509.
U.S. Appl. No. 15/286,421, filed Oct. 5, 2016, Tan et al.
U.S. Appl. No. 15/719,497, filed Sep. 28, 2017, Tan et al.
U.S. Appl. No. 15/824,987, filed Nov. 28, 2017, Yang et al.
U.S. Appl. No. 15/841,205, filed Dec. 13, 2017, Kanarik et al.
U.S. Notice of Allowance dated Sep. 28, 2017 issued in U.S. Appl. No. 15/286,421.
U.S. Notice of Allowance [Supplemental Notice of Allowability] dated Oct. 26, 2017 issued in U.S. Appl. No. 15/286,421.
U.S. Office Action dated Jun. 17, 2016 issued in U.S. Appl. No. 14/696,254.
U.S. Notice of Allowance dated Oct. 14, 2016 issued in U.S. Appl. No. 14/696,254.
U.S. Notice of Allowance dated Jun. 29, 2017 issued in U.S. Appl. No. 15/400,368.
U.S. Office Action dated Mar. 29, 2018 issued in U.S. Appl. No. 15/719,484.
U.S. Notice of Allowance dated Jan. 11, 2018 issued in U.S. Appl. No. 14/830,683.
PCT International Search Report and Written Opinion dated Feb. 25, 2016 issued in PCT/US2015/066789.
PCT International Search Report and Written Opinion dated Apr. 5, 2018 issued in PCT/US2017/066470.
Chinese First Office Action dated Mar. 30, 2018 issued in CN 201610248296.8.
Chinese First Office Action dated Dec. 27, 2017 issued in CN 201610017911.4.
U.S. Office Action dated Jul. 21, 2015 issued in U.S. Appl. No. 14/446,203.
U.S. Notice of Allowance dated Feb. 5, 2016 issued in U.S. Appl. No. 14/446,203.
U.S. Office Action dated May 23, 2017 issued in U.S. Appl. No. 15/173,358.
U.S. Office Action dated Nov. 29, 2017 issued in U.S. Appl. No. 15/421,189.
U.S. Notice of Allowance dated Jan. 29, 2018 issued in U.S. Appl. No. 15/173,358.
U.S. Notice of Allowance dated Apr. 25, 2018 issued in U.S. Appl. No. 15/421,189.
Taiwanese First Office Action dated Oct. 24, 2017 issued in TW 103126076.
DeSalvo, G. et al., (1996) "Controlled Digital Etching of GaAs for Precise Gate Recess Formation in MESFET, HEMT and pHEMT Device Fabrication," [http://csmantech.pairserver.com/newsite/gaasmantech/Digests/1996/papers/1996%202.2%20controlled%20digital%20etching%20gaas.pdf], pp. 29-31.
Higham, Eric, (2016) "The Compound Semiconductor Industry; How Did It Get Here and Where Is It Going?," SemiCon WEST Jul. 12-14, 2016 [http://www.semiconwest.org/sites/semiconwest.org/files/datal5/docs/2_Eric%20Higham_Strategy%20Analytics.pdf], 27pp.
Kanarik et al. (Mar./Apr. 2015) "Overview of atomic layer etching in the semiconductor industry," *J. Vac. Sci. Technol. A* 33(2):020802-1-020802-14.
Kim, Jong Kyu, et al., (Nov./Dec. 2013) "Atomic layer etching removal of damaged layers in a contact hole for low sheet resistance," Journal of Vacuum Science & Technology, 31(6):8.
Metzler et al., (Mar./Apr. 2014) "Fluorocarbon assisted atomic layer etching of SiO2 using cyclic Ar/C4F8 plasma," Journal of Vacuum Science & Technology A, 32(2):5.
Oehrlein, Gottlieb S., "Atomic Layer Etching of SiO2: Challenges and Opportunities*," University of Maryland, Atomic Layer Etch and Atomic Layer Clean Technology Workshop, San Francisco, Apr. 21, 2014, 22 pages.
U.S. Appl. No. 15/954,509, filed Apr. 16, 2018, Lai et al.
U.S. Appl. No. 15/841,205, filed Dec. 13, 2017, Kanarik.

* cited by examiner

ATOMIC LAYER ETCHING OF TUNGSTEN AND OTHER METALS

CROSS REFERENCE TO RELATED APPLICATION

This application claims the benefit of priority to U.S. Provisional Application No. 62/207,250, title "ATOMIC LAYER ETCHING OF TUNGSTEN AND OTHER METALS," filed Aug. 19, 2015, all of which is incorporated herein by this reference in its entirety and for all purposes.

BACKGROUND

Semiconductor fabrication processes often involve deposition of metals, such as tungsten, into features to form contacts or interconnects. As devices shrink, features become smaller and harder to fill, particularly in advanced logic and memory applications. Fabrication of metal contacts, metal interconnects, or other metal structures may involve etch back of the metal.

One aspect of the disclosure relates a method of etching a metal on a substrate, the metal being selected from tungsten (W) and cobalt (Co). It involves (a) exposing a surface of the metal to a halide chemistry to form a modified halide-containing surface layer; and (b) applying a bias voltage to the substrate while exposing the modified halide-containing surface layer to a plasma to thereby remove the modified halide-containing surface layer. In some embodiments, the plasma is an argon plasma and the bias voltage in (b) is between about 50 Vb and 80 Vb.

In some implementations, the modification operation of (a) includes exposing the surface of the metal to a plasma. If a plasma is used during (a), a bias may or may not be applied to the substrate during (a). The substrate temperature may be maintained to prevent spontaneously etching the metal. For example, in some embodiments, (a) involves exposing a tungsten surface to a chlorine-containing plasma at temperatures less than 150° C. to prevent spontaneous etch of the tungsten by the plasma.

Also provided is an apparatus for processing semiconductor substrates, the apparatus including: a process chamber comprising a showerhead and a substrate support, a plasma generator, and a controller having at least one processor and a memory, wherein the at least one processor and the memory are communicatively connected with one another, the at least one processor is at least operatively connected with flow-control hardware, and the memory stores machine-readable instructions for: (i) introducing a halide-containing gas to modify a tungsten surface; and (ii) introducing an activation gas and igniting a plasma to etch at least part of the modified surface of tungsten. In some implementations, the memory further stores machine-readable instructions for igniting a plasma during (i). In some embodiments, the halide-containing gas is a chlorine-containing gas and memory further stores machine-readable instructions for maintaining a temperature of the substrate support at less than 150° C. during (i).

These and other aspects of the disclosure are discussed further below.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Tungsten metal is used in semiconductor industry for its relatively low resistivity and electromigration properties. It is currently used as a low-resistive metallic interconnect, and is being tested for use in emerging memory applications. A number of applications require etching tungsten, and it can be challenging etch in controlled manner with atomic precision. For example, the uniformity of tungsten etched may need to be within 1 nm across the wafer, feature-to-feature, and at the surface, referring the smoothness. When etching tungsten in features, small openings (e.g., less than 20 nm) and loading effects in which different feature sizes have different etch rates provide additional challenges. Conventional etching using a continuous process does not offer sufficient etch control for advanced applications of tungsten etching.

In another example, cobalt may be used as an interconnect material in place of copper. Replacing copper with cobalt introduces its own processing challenges, including, for example, etching of cobalt. Currently, Co can be etched back using a wet process. However, the wet etch rate can be variable with changes in feature size. In addition, the wet process may cause the surface of the substrate to be significantly rough, e.g., rougher than a surface etched by a dry process. Etching back Co using anisotropic plasma etching has proven to be very difficult as the etch products are almost all or often non-volatile. Non-volatile etch products may result in re-deposition of the etch products or defects on other exposed components of the substrate. These re-deposited defects contain metal and are difficult if not impossible to remove. As a result, plasma etching of this metal is often conventionally achieved with physical sputtering, which unfortunately leads to etch selectivity so poor that the process cannot be used in production.

Provided herein are methods of atomic layer etching (ALE) of metals including tungsten (W), titanium (Ti), and cobalt (Co), as well as ALE etching of metal nitrides and metal oxides including tungsten nitride (WN), tantalum oxide ($Ta_2O_3$), tantalum nitride (TaN), titanium oxide (TiO), and titanium nitride (TiN), and ALE etching of the metalloid germanium (Ge). References herein to metals refer to elemental forms of the metals. Similarly, unless otherwise specified, germanium refers to elemental germanium. References herein to metal oxides and metal nitrides refer to oxide and nitride compounds of the metals without being limited to a particular stoichiometric ratio and include compounds such as oxynitrides. It is understood that there may be some amount of impurities present in a layer or film of a metal, metal compound or germanium.

The methods disclosed herein provide precise etch control down to the atomic level, with etching a low as 1 Å to 10 Å per cycle in some embodiments. In some embodiments, directional control is provided without damage to the surface of interest.

ALE is a technique that removes thin layers of material using sequential self-limiting reactions. Generally, ALE may be performed using any suitable technique. Examples of atomic layer etching techniques are described in U.S. Pat. No. 8,883,028, issued on Nov. 11, 2014; and U.S. Pat. No. 8,808,561, issued on Aug. 19, 2014, which are herein incorporated by reference for purposes of describing example atomic layer etching techniques. In various embodiments, ALE may be performed with plasma, or may be performed thermally. The concept of an "ALE cycle" is relevant to the discussion of various embodiments herein. Generally an ALE cycle is the minimum set of operations used to perform an etch process one time, such as etching a monolayer. The result of one cycle is that at least some of a film layer on a substrate surface is etched. Typically, an ALE cycle includes a modification operation to form a reactive layer, followed by a removal operation to remove or etch only this modified layer. The cycle may include certain ancillary operations such as sweeping one of the reactants or byproducts. Generally, a cycle contains one instance of a unique sequence of operations. As an example, an ALE cycle may include the following operations: (i) delivery of a reactant gas, (ii) purging of the reactant gas from the chamber, (iii) delivery of a removal gas and an optional plasma, and (iv) purging of the chamber. According to various embodiments, etching may be performed conformally or nonconformally.

Figure 1:
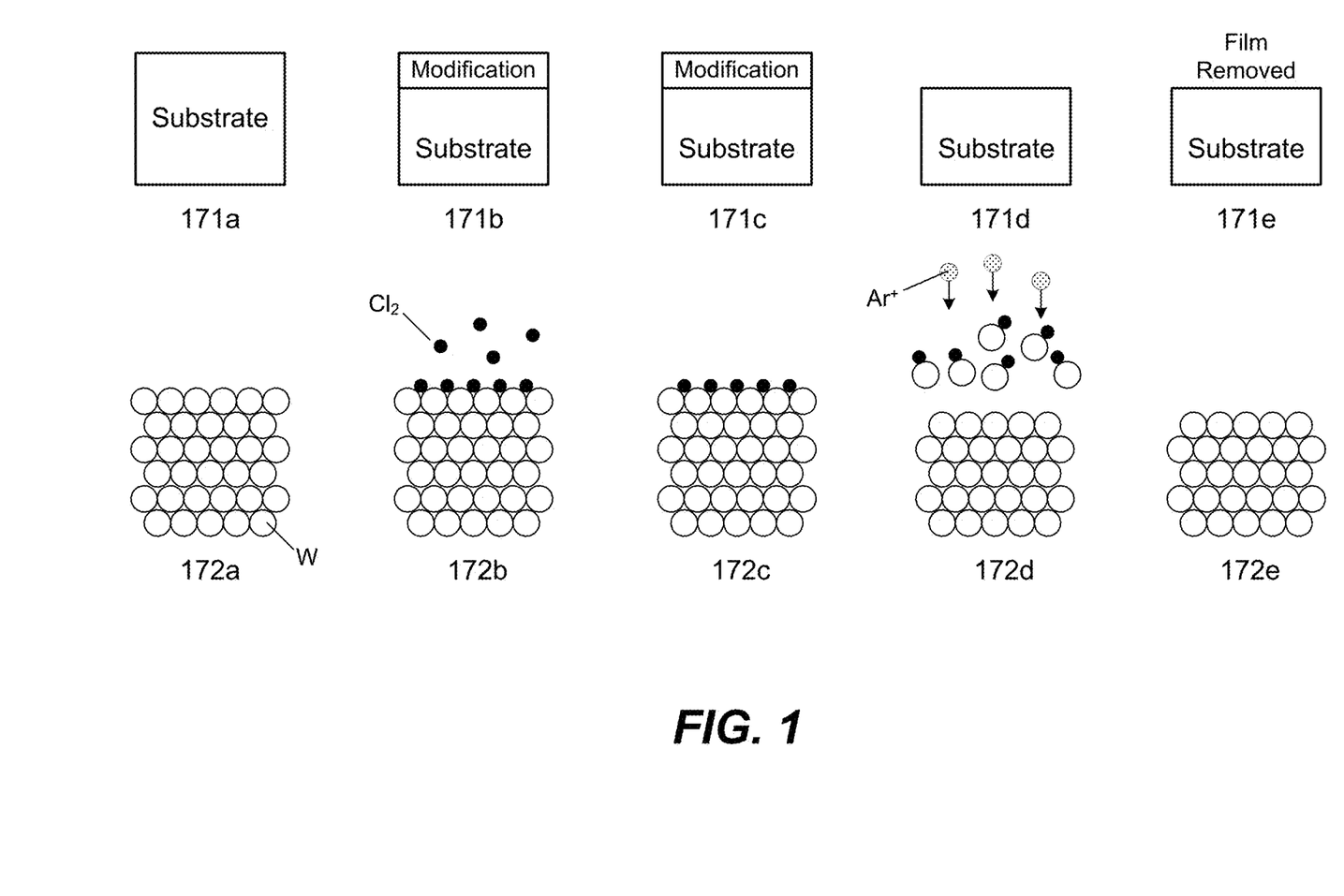
FIG. 1 is a schematic illustration of an example of atomic layer etching (ALE) of film on a substrate.

FIG. 1 shows two example schematic illustrations of an ALE cycle. Diagrams 171a-171e show a generic ALE cycle. In 171a, a substrate is provided. In 171b, the surface of the substrate is modified. In 171c, the chemical used to modify the substrate is purged. In 171d, the modified layer is being etched. In 171e, the modified layer is removed. Similarly, diagrams 172a-172e show an example of an ALE cycle for etching a tungsten film. In 172a, a tungsten layer on a substrate is provided, the layer including many tungsten atoms. In 172b, reactant gas chlorine is introduced to the substrate, which modifies the surface of the tungsten layer. The schematic in 172b shows that some chlorine is adsorbed onto the surface of the tungsten as an example. In 172c, the reactant gas chlorine is purged from the chamber. In 172d, an argon removal gas is introduced with a directional plasma, as indicated by the Ar$^+$ plasma species and arrows, to remove the modified surface of the substrate. The activated etching involves the use of inert ions (e.g., Ar$^+$) operating with energy below the sputtering threshold to energize the adsorb species (in this example, Cl species) to etch away the substrate one monolayer at a time. During this operation, a bias is applied to the substrate to attract ions toward it. In 172e, the chamber is purged and the byproducts are removed.

ALE etches uniformly due to the self-limiting nature of the surface reactions. Thus, ALE processes provide high control over the etching operations such that the amount of material removed in each cycle is limited and not etched too quickly so as to prevent completely etching of material from the surface of the feature.

Disclosed embodiments involve modification of a metal, metal oxide, metal nitride, or germanium surface by modification of the surface with a halide chemistry and exposure to an activation gas to remove the modified surface.

ALE of metals and metal compounds may present several challenges, including a modification chemistry that interacts with the surface to form a modified layer without spontaneously etching the surface. The self-limiting behavior described above with respect to FIG. 1 does not occur if the modification reactant spontaneously etches the tungsten surface. Because halides are used in conventional continuous etching of tungsten and other metals, it was unexpected that they could be used for ALE. No etching may occur if the modification chemistry does not form a modified layer. While chlorination has been used to modify surfaces such as silicon in ALE processes, it has been thought that the chlorination of such surfaces occurs due to the electronegativity mismatch between chlorine and silicon such that chlorine attracts an electron from the silicon, weakening the underlying bond. It was not clear that such a mechanism could work with metal surfaces such as tungsten.

The materials that may be etched by the embodiments disclosed herein include W, Ti, and Co, tungsten nitrides (WN$_x$), tantalum oxides (TaO$_x$), tantalum nitrides (TaN$_x$), titanium oxides (TiO$_x$), titanium nitrides (TiN$_x$), and Ge. In the case of compound films, x may be any appropriate non-zero positive number.

As shown in the example of FIG. 1 at 171b, a surface to be etched is exposed to a modification chemistry that interacts with the surface to form a modified layer. In the methods disclosed herein, a halide modification chemistry is employed. The halide modification chemistry may include a bromine (Br)-containing, chlorine (Cl)-containing, or fluorine (F)-containing compound. Examples of Br-containing modification chemistries include dibromine (Br$_2$) and hydrogen bromide (HBr). Examples of Cl-containing modification chemistries include chlorine (Cl$_2$), boron trichloride (BCl$_3$) and silicon tetrachloride (SiCl$_4$). Examples of fluorine-containing modification chemistries include sulfur hexafluoride (SF$_6$), carbon tetrafluoride (CF$_4$), and silicon tetrafluoride (SiF$_4$). In some embodiments, a halide modification chemistry may include two or more halogen-containing compounds. As an example, a Cl$_2$/BCl$_3$ mixture may be used to prevent or reduce oxidation during ALE.

The halide modification chemistry interacts with the surface without spontaneously etching it. Nitrogen trifluoride (NF$_3$) is generally too strong to be employed in ALE of the surfaces disclosed herein as it spontaneously etches rather than modifies the surface. The successful use of SF$_6$ for ALE of tungsten was unexpected, as it was expected to also spontaneously etch tungsten. Without being bound by a particular theory, it is believed that SF$_6$ and CF$_4$ may modify the surface by forming an adsorbed polymer layer on it, thereby allowing the self-limiting synergistic etch that ALE provides.

In another example, in some embodiments, a boron-containing compound may be used to deposit a thin boron-containing layer on a surface. For example, U.S. patent application Ser. No. 14/794,285, filed Jun. 24, 2015, incorporated by reference herein, discloses Co etch by forming a thin BCl$_x$ layer on Co. An activated activation gas, plasma, and activated halides from the surface of the substrate as deposited may perform an atomic layer etch. The $BCl_3$ used in this approach can be replaced with other chemistry that can provide comparable deposition and activation functions, such as boron tribromide ($BBr_3$) and boron triiodine ($BI_3$).

According to various embodiments, the modification operation may include exposure to a plasma. Exposure to a plasma may increase throughput by increasing the rate at which the surface is modified. For example, plasma can be used to speed up the modification by producing highly reactive radicals and/or other energetic species to induce the surface modification. However, certain plasma conditions may facilitate undesirable spontaneous etching. As discussed further below, a plasma generated from $Cl_2$ may spontaneously etch the tungsten at temperatures greater than 150° C.

Depending on the surface to be modified and the modification chemistry, a plasma may be used to modify surfaces that do not undergo modification in the absence of a plasma. For example, while chlorine can spontaneously form a bond with silicon atoms of a silicon surface and germanium atoms of a germanium surface such that a plasma is optional, tungsten surfaces will generally not undergo chlorination unless there is sufficient energy to generate Cl atoms from $Cl_2$ or other Cl source. Plasma chlorination generates Cl atoms. Thermal energy may also be sufficient to break apart $Cl_2$, though at temperatures higher than typical thermal budgets.

If a plasma is employed during the modification operation, a bias may or may not be used. In many cases, a bias is not used to avoid ion bombardment and sputtering. However, a small bias may be useful to provide directionality to the modification species. For example, as described in patent application Ser. No. 14/830,683, issued as U.S. Pat. No. 9,972,504, which is incorporated by reference herein, a low bias power may be used in ALE of a tungsten in a recessed feature that is partially filled with tungsten. The low bias prevents sputtering while allowing modification species to be adsorbed on the surface of the metal. The bias can facilitate the modification species entering a seam formed opening in the feature, for example. Example biases during a modification operation may range from 0 Vb to 100 Vb, 0 Vb to 50 Vb, or 0 Vb to 20 Vb.

The terms "bias power" and "bias voltage" are used herein to describe a bias that is applied to the pedestal. A threshold bias power refers or threshold bias voltage refers to the maximum voltage of the bias applied to a pedestal before material on the surface of a substrate on the pedestal is sputtered. The threshold bias power therefore depends in part on the material to be etched, the gas used to generate plasma, plasma power for igniting the plasma, and plasma frequency. Bias power or bias voltage as described herein is measured in volts, which are indicated by the unit "V" or "Vb", where b refers to bias.

Figure 2:
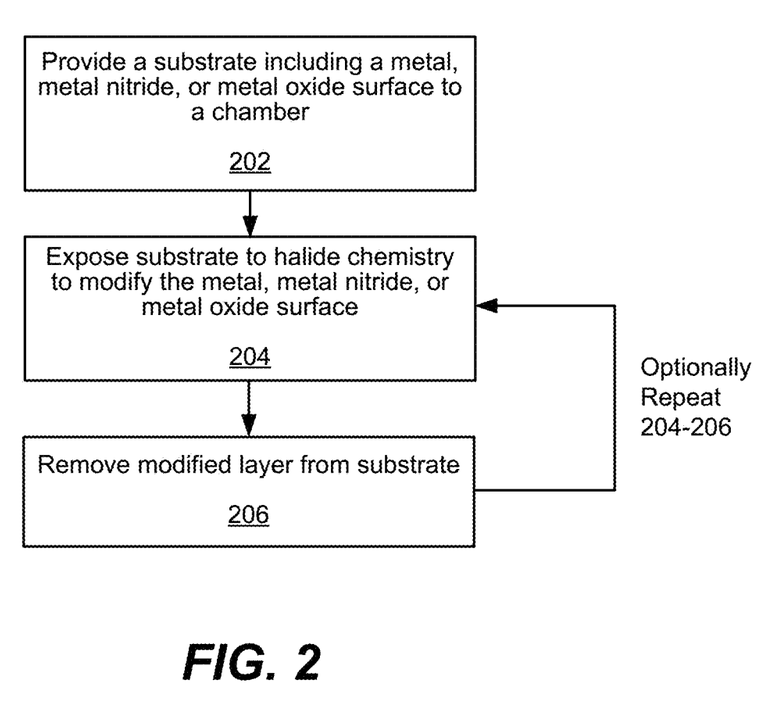
FIG. 2 is a process flow diagram depicting operations performed in accordance with certain disclosed embodiments.

FIG. 2 provides a process flow diagram depicting operations in a method in accordance with disclosed embodiments. In operation 202 of FIG. 2, a substrate is provided to a chamber. The substrate may be a silicon wafer, e.g., a 200-mm wafer, a 300-mm wafer, or a 450-mm wafer, including wafers having one or more layers of material such as dielectric, conducting, or semi-conducting material deposited thereon. A patterned substrate may have features such as vias or contact holes, which may be characterized by one or more of narrow and/or re-entrant openings, constrictions within the features, and high aspect ratios. The features may be formed in one or more of the above described layers.

One example of a feature is a hole or via in a semiconductor substrate or a layer on the substrate. Another example is a trench in a substrate or layer.

The substrate includes an exposed surface of a metal, metal oxide or metal nitride film as described above. According to various embodiments, the exposed surface may be present on vertical surfaces (e.g., sidewalls of a feature), horizontal surfaces (e.g., blanket layers, field regions, or feature bottoms), or both. In some embodiments, for example, a metal may be etched from a feature partially filled with the metal. In some embodiments, for example, a substrate includes a blanket layer of the metal or metal compound film. The substrate may further include a patterned mask layer previously deposited and patterned on the substrate. The material to be etched by ALE may have been previously deposited by any suitable such as atomic layer deposition (ALD), chemical vapor deposition (CVD), sputtering and other physical vapor deposition (PVD) methods, or electro or electroless plating.

In operation 204, the substrate is exposed to a halide chemistry to modify the exposed metal or metal compound surface of the substrate. The halide chemistry may be provided as a gas or as a plasma. In some embodiments, reactive or activated species may be provided, e.g., atomic species, radicals, or high energy molecules. Activation may include plasma activation, thermal activation, ultraviolet activation, and the like. For example, in some embodiments, a gas may be activated by exposure to heat, radiation, or other energy source prior to entering the chamber or while in the chamber. In some embodiments, atomic or radical species may be delivered to the chamber, for example, from a remote plasma generator.

The modification operation forms a thin, reactive surface layer with a thickness that is more easily removed than un-modified material. According to various embodiments, halide species may adsorb onto or react with the exposed metal or metal compound surface to thereby modify it. Example halide chemistries are described above and include $Br_2$, HBr, $Cl_2$, $BCl_3$, $SiCl_4$, $SF_6$, $CF_4$, and $SiF_4$. According to various embodiments, these may be supplied to the chamber as a gas, either alone or with a carrier gas or other gas. Examples of carrier gases include nitrogen ($N_2$), argon (Ar), neon (Ne), helium (He), and combinations thereof. In some embodiments, hydrogen ($H_2$) may be added to balance the concentration of halide species.

The particular halide chemistry may be chosen based on the material to be etched, with a chemistry that can be modify the surface to be etched chosen. In addition, the chemistry may be chosen to tune the etch rate, control over the amount of material removed, selectivity to an underlying layer or another exposed material on the substrate, and to limit oxidation.

For example, fluorine-containing chemistries result in faster etch than chlorine-based chemistries, with a few monolayers etched per cycle in some embodiments. This can be advantageous to increase throughput where there is a substantial amount of material to be etched. In applications in which very precise control of removal may be appropriate, a chlorine-containing chemistry may be used. Selectivity may also be controlled by the halide modification chemistry. For example $Cl_2$ or $Cl_2/BCl_3$ for metal etch is highly selectivity to dielectrics like SiN or SiO, so mass preservation is better with those chemistries. In some embodiments, the methods include using a mixture of a $Cl_2$ and a boron-containing compound, such as $BCl_3$. Without being bound a particular theory, it is believed that the addition of boron may prevent unwanted oxidation of a surface. However, too much boron may lead to deposition. In some embodiments, the $Cl_2/BCl_3$ mixture is between 0.5% and 10% (volumetric) $BCl_3$, e.g., about 5% $BCl_3$.

If plasma modification is employed, a plasma may be generated in the chamber from the gas. This may generate various activated species from the halide-containing gas. References herein to a halide-containing gas or halide chemistry are understood to include species generated from such a gas. In some embodiments, the plasma may be controlled such that the activated species in the chamber during operation 204 are primarily or substantially radical species. In some embodiments, essentially no ionic species are in the chamber. This may facilitate chemical modification, rather than etching, of the substrate surface. However, as described above, in some embodiments, a bias may be employed to attract modification species. In such embodiments, the plasma may be controlled such that there are low energy ionic species present.

Using a bias in the modification operation allows control of the depth of the modification and the subsequent removal. This can be advantageous for etching in high aspect ratio features, and offers control over whether or not the ALE penetrates into a feature or substantially remains on the field and upper edges of a feature.

In some embodiments, a purge may be performed after a modification operation. In a purge operation, non-surface-bound active modification species may be removed from the chamber. This can be done by purging and/or evacuating the process chamber to remove the modification gas, without removing the adsorbed layer. The species generated in a plasma can be removed by extinguishing the plasma and allowing the remaining species to decay, optionally combined with purging and/or evacuation of the chamber. Purging can be done using any inert gas such as $N_2$, Ar, Ne, He and their combinations.

In operation 206, the modified layer is removed from the substrate using an activated removal gas, such as an activating gas, sputtering gas, or chemically reactive gas. For example, argon may be used. In a removal operation, the substrate may be exposed to an energy source (e.g. activating or sputtering gas or chemically reactive species that induces removal), such as argon or helium, to etch the substrate. In some embodiments, the removal operation may be performed by ion bombardment.

In embodiments in which ion bombardment is used, the ALE is directional and etches the horizontal surfaces preferentially over vertical surfaces such as sidewalls. However, in some embodiments, removal may be isotropic.

The amount of removal gas may be controlled such as to etch only a targeted amount of material. In various embodiments, the pressure of the chamber may vary between the modification and removal operations. The pressure of the removal gas may depend on the size of the chamber, the flow rate of the removal gas, the temperature of the reactor, the type of substrate, the flow rate of any carrier gases, and the amount of material to be etched.

During removal, a bias may be optionally applied to facilitate directional ion bombardment. The bias power is selected to prevent sputtering but allow the removal gas to etch the material. The bias power may be selected depending on the threshold sputter yield of the activated removal gas with the metal or metal-containing compound film on the substrate. Sputtering as used herein refers physical removal of at least some of a surface of a substrate. Ion bombardment refers to physical bombardment of a species onto a surface of a substrate.

Figure 3:
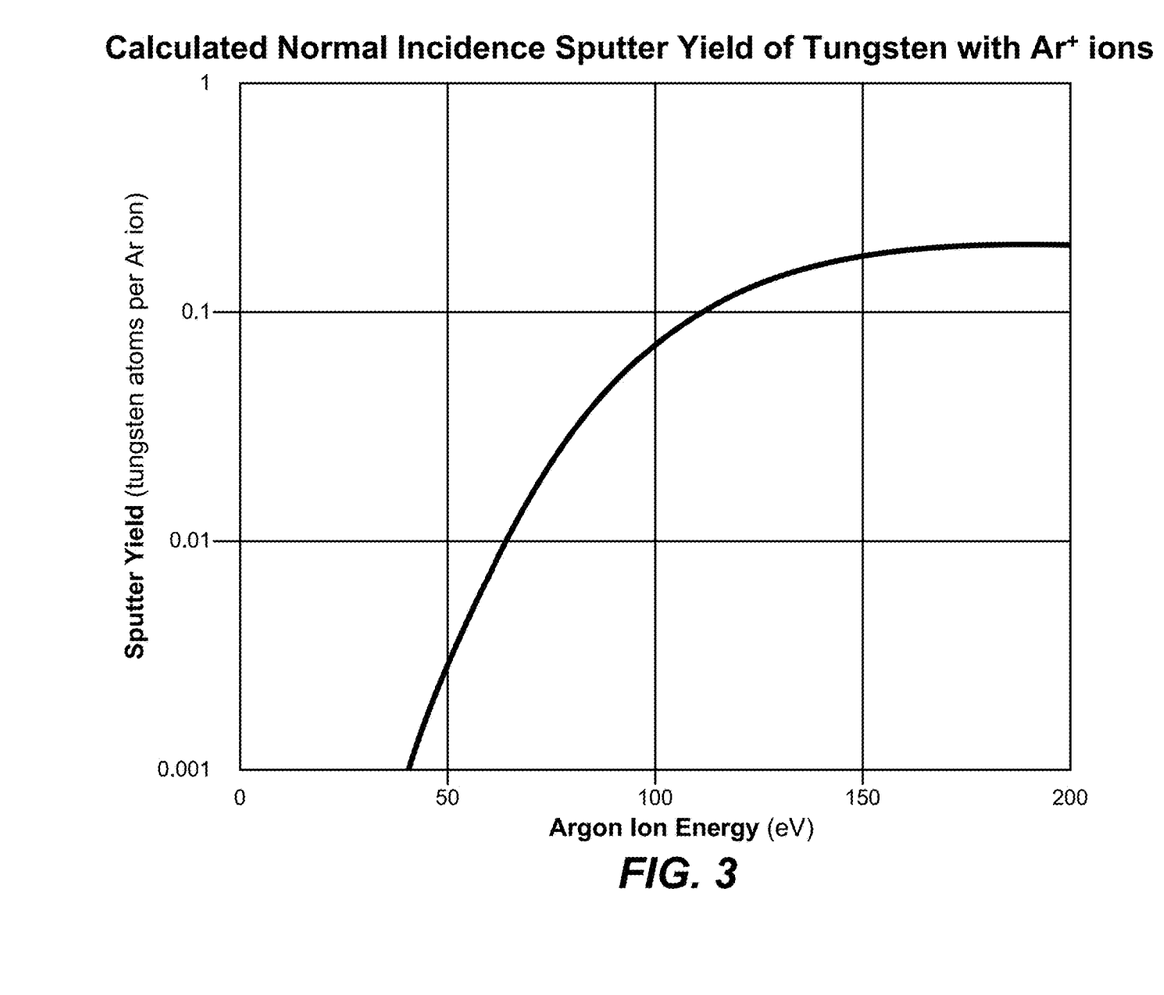
FIG. 3 is a graph of calculated normal incident sputter yield of tungsten using argon ions.

FIG. 3 shows an example sputter yield calculated based on "Energy Dependence of the Yields of Ion-Induced Sputtering of Monatomic Solids" by N. Matsunami, Y. Yamamura, Y. Itikawa, N. Itoh, Y. Kazumata, S. Miyagawa, K. Morita, R. Shimizu, and H. Tawara, IPPJ-AM-32 (Institute of Plasma Physics, Nagoya University, Japan, 1983).

The figure shows the calculated normal incidence sputter yield of tungsten with argon atoms versus argon ion energy (or threshold bias power). The calculation used a value of 32 eV for the sputter threshold. Slightly above the threshold, namely at 40 eV argon ion energy, the sputter yield is seem to be about 0.001 atoms/ion. However, at 80 eV ion energy, it has increased by a factor of 30. This example curve indicates the maximum argon ion energy sufficient to etch the metal while preventing sputtering of argon on the substrate. While FIG. 3 provides a qualitative representation of a sputter threshold curve, a sputter threshold may be experimentally determined for a particular system and maximum tolerable sputter yield. For one system, sputtering of tungsten is observed at 80 Vb for argon ions. As such, the bias power during tungsten removal using argon ions may be set at less than about 80 Vb, or less than about 50 Vb, or between about 50 Vb and 80 Vb. In some embodiments, operation 206 may be performed above the threshold bias power if some small amount of sputtering is tolerable. There may also be a removal threshold voltage, below which removal does not occur, depending on the particular process. It should be noted that the sputter threshold varies according to the metal, metal compound, or other material to be etched.

Returning to FIG. 2, in some embodiments, the chamber may be purged after operation 206. Purge processes may be any of those used for a purge after operation 204 as discussed above.

As described herein, in operations where materials are introduced into the chamber, in some embodiments involving atomic layer etch using a plasma, the reactor or chamber may be stabilized by introducing the chemistry into the chamber prior to processing the substrate or wafer. Stabilizing the chamber may use the same flow rates, pressure, temperatures, and other conditions as the chemistry to be used in the operation following the stabilization. In some embodiments, stabilizing the chamber may involve different parameters. In some embodiments, a carrier gas, such as $N_2$, Ar, Ne, He, and combinations thereof, is continuously flowed during operations 204 and 206. In some embodiments, a carrier gas is only used during operation 106. In some embodiments, a carrier gas is not flowed during removal.

Performing operations 204 and 206 may, in some embodiments, constitute performing ALE once. If the material is not sufficiently etched, operations 204 and 206 may be repeated. In various embodiments, the modification and removal operations may be repeated in cycles, such as about 1 to about 30 cycles, or about 1 to about 20 cycles. Any suitable number of ALE cycles may be included to etch a desired amount of film. In some embodiments, ALE is performed in cycles to etch about 1 Å to about 50 Å of the surface of the layers on the substrate. In some embodiments, cycles of ALE etch between about 2 Å and about 50 Å of the surface of the layers on the substrate.

If repeated, the chemistries and process conditions during operations 204 and 206 may be constant or vary from cycle to cycle. For example, in some embodiments, a different halide chemistry may be used. As described above, fluorine-containing chemistries may be useful for faster etch, while chlorine-containing chemistries may provide more control. As such it may be advantageous to vary the chemistry from cycle-to-cycle, for example, to move from a more aggressive etch using a fluorine-containing chemistry to a less aggressive etch using a chlorine-containing chemistry. In some embodiments, the chemistry may be modified toward the end of an etch process to provide high selectivity to an underlying material. In another example, in some embodiments, the bias voltage may be lowered toward the end of the etch process. For example, at 0.5 nm, 1 nm, or other appropriate amount left to etch, the bias voltage may be lowered. In some embodiments, the bias voltage may be modified to a voltage that provides high selectivity to an underlying material.

Process parameters can vary depending on the apparatus used as well as the modification chemistry, removal species and material to be etched. In various embodiments, the plasma may be an inductively coupled plasma or a capacitively coupled plasma or a microwave plasma. If a plasma is employed during a modification operation, the power and pressure may be controlled to prevent or reduce dielectric etch. As indicated above, silicon-containing dielectrics are susceptible to etch by fluorine-containing chemistries. As such, fluorine adsorption or other modification is conducted at mild conditions; it can be useful to operate in a low power regime to preserve mass. Higher pressure is also be beneficial in reducing unwanted dielectric etch.

Temperature may controlled to provide smooth surfaces. In some embodiments, when using a chlorine plasma, ALE of tungsten is performed at a temperature below about 150° C. At temperatures above about 150° C., tungsten may spontaneously etch in the presence of chlorine plasma. This can lead to etching during the chlorine-containing step as well as during the subsequent Ar plasma, which can result in a process that is closer to continuous etching than ALE. Moreover, because chlorine etching dominates, the resulting surface may be rough.

Power for an inductively coupled plasma may be set at between about 30 W and about 1500 W. As indicated above, power may be set at a low enough level so as not to cause direct plasma etching of the substrate. Example ranges may be between 30 W and 500 W, or 30 W and 200 W. Power is given for a 300 mm wafer and scales with surface area. Example pressures may be between 10 Torr to 80 Torr, or 30 Torr to 60 Torr. During the removal operation, lower pressure, e.g., 2 mTorr to 90 mTorr may be used.

While the above description focuses on metal, metal oxide and metal nitride films, the methods disclosed herein may be used for ALE of germanium. In embodiments in which germanium is to be etched anisotropically from a feature, it may be advantageous to oxidize the germanium surface every n cycles to protect the sidewalls of the feature from being etched. This is because germanium is highly reactive.

EXAMPLES

Figure 4:
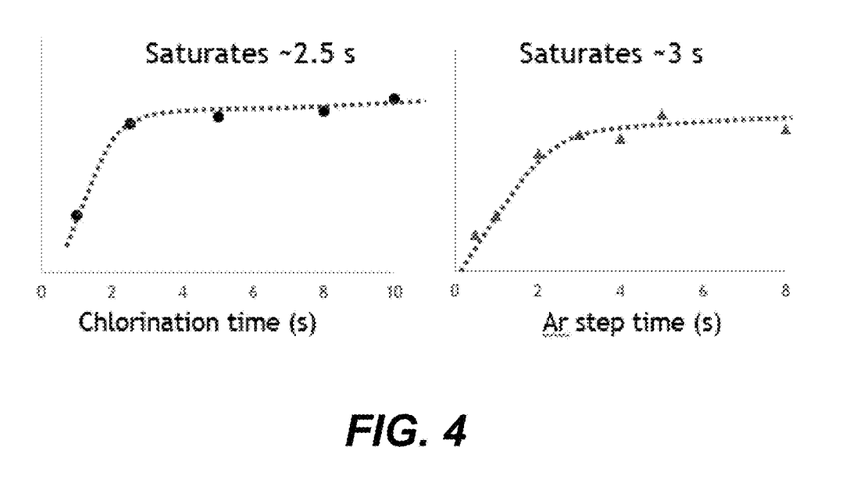
FIG. 4 shows graphs qualitatively illustrating etch rate for ALE as a function of chlorination time and argon removal step time for an ALE process including plasma chlorination and removal by an activated argon gas.

ALE of Tungsten: FIG. 4 shows graphs qualitatively showing ALE etch rate as function of chlorination time and argon removal time for ALE etch of tungsten. The graphs in FIG. 4 demonstrate self-limiting behavior, indicating that the etch of tungsten is not spontaneous and that ALE was successfully implemented. Plasma chlorination was employed.

Figure 5:
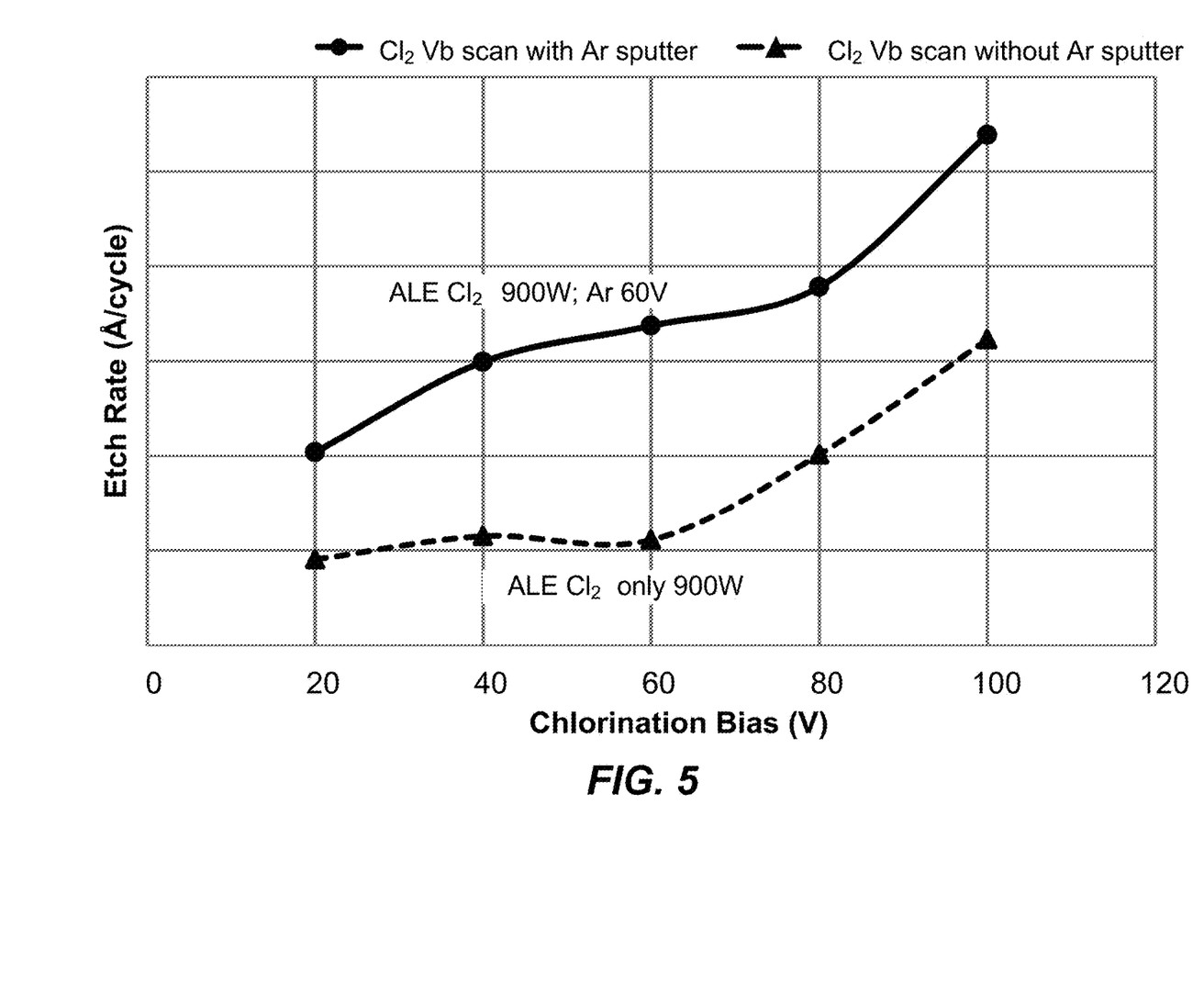
FIG. 5 is a graph of experimental data collected for etch rates of tungsten over chlorination bias power.

Etch rate of tungsten was plotted against chlorination bias power for etch with chlorine adsorption and no argon ion bombardment, as well as for an atomic layer etch (ALE) process with chlorine adsorption with argon ion bombardment. The results are plotted in FIG. 5. The dotted line depicts the etch rate of tungsten versus chlorination bias (e.g., the bias power during chlorine adsorption) for a process involving adsorbing chlorine and igniting a plasma at 900 W, and no argon ion bombardment. The solid line depicts the etch rate of tungsten versus chlorination bias for a process involving adsorbing chlorine and igniting a plasma at 900 W, followed by an argon ion bombardment with a bias power of 60V. A chlorination bias threshold voltage as shown in FIG. 5 is at about 60V. Note where a chlorination bias is less than 60V, tungsten is not etched without using ion bombardment of argon. Where a chlorination bias is greater than 60V, the etch rate of tungsten without argon ion bombardment is much lower than that of the process with argon ion bombardment. These results suggest that argon ion bombardment may be used to modulate the etch rate of metals by ALE methods in various embodiments whereby 1) chlorine is being adsorbed onto the tungsten substrate without etching during chlorination, and 2) the bias power during ion bombardment of argon is controlled to reduce or prevent physical removal (or sputtering) by setting the bias power lower than the sputter threshold.

Further examples of ALE tungsten to facilitate feature fill are provided in concurrently filed U.S. patent application Ser. No. 14/830,683, which is incorporated by reference herein and for all purposes.

Figure 6:
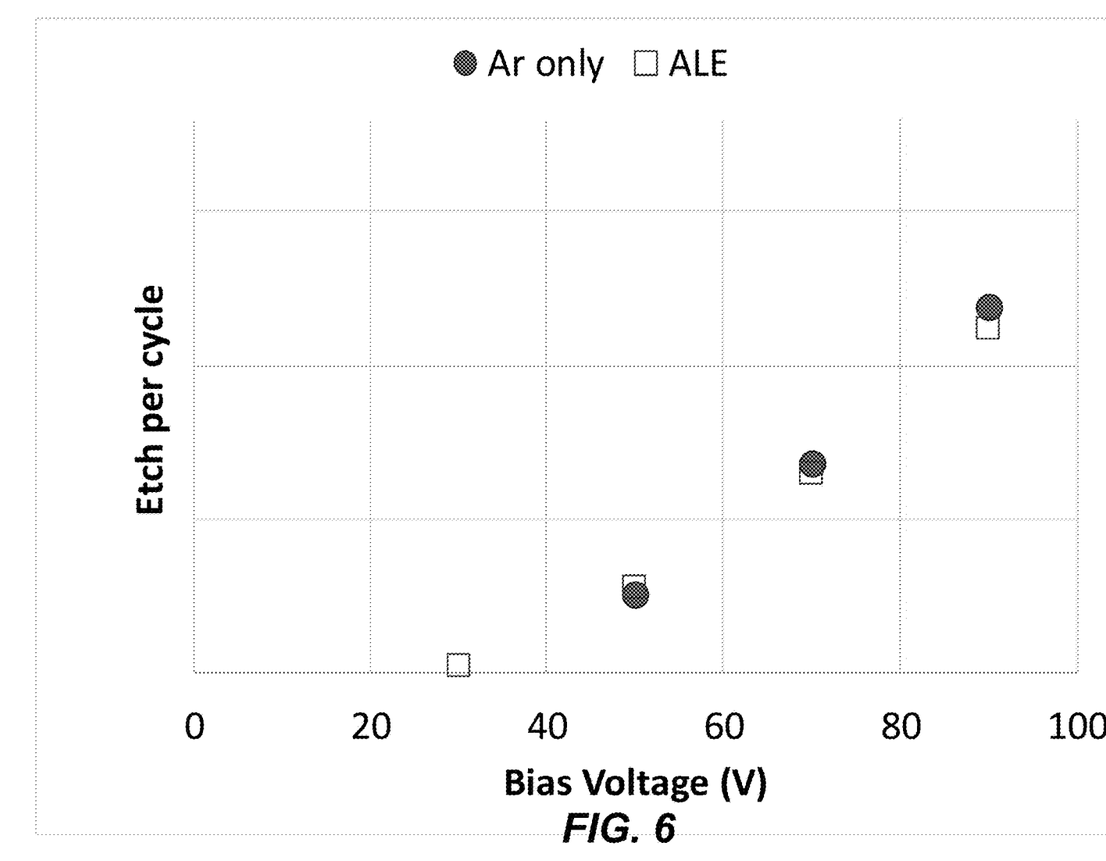
FIG. 6 is a graph comparing etch rates of tantalum etches using argon removal only versus argon removal following plasma chlorination as functions of bias voltage.

Tantalum Etch: Plasma chlorination followed by an Ar removal (ALE cycles) was employed to etch tantalum metal and compared to Ar removal only. Results are plotted in FIG. 6, which shows no synergistic effect. Specifically, the chlorination of the ALE cycles did not improve etch rate. This indicates that ALE was unsuccessful.

Apparatus

Inductively coupled plasma (ICP) reactors which, in certain embodiments, may be suitable for atomic layer etching (ALE) operations and atomic layer deposition (ALD) operations are now described. Such ICP reactors have also been described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 7:
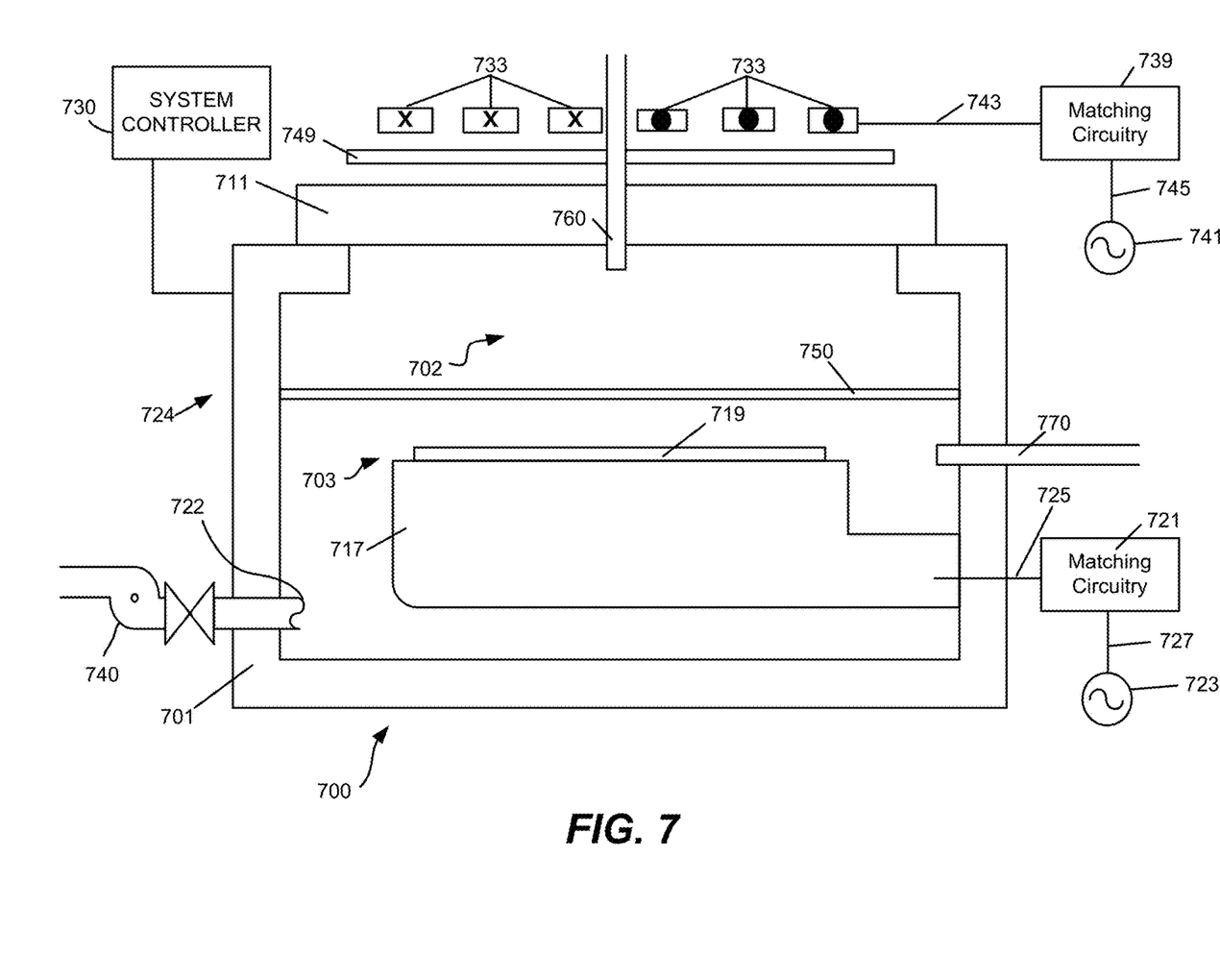
FIG. 7 is a schematic diagram of an example process apparatus for performing certain disclosed embodiments.

FIG. 7 schematically shows a cross-sectional view of an inductively coupled plasma integrated etching and deposition apparatus 700 appropriate for implementing certain embodiments herein, an example of which is a Kiyo® reactor, produced by Lam Research Corp. of Fremont, Calif. The inductively coupled plasma apparatus 700 includes an overall process chamber 724 structurally defined by chamber walls 701 and a window 711. The chamber walls 701 may be fabricated from stainless steel or aluminum. The window 711 may be fabricated from quartz or other dielectric material. An optional internal plasma grid 750 divides the overall process chamber 724 into an upper sub-chamber 702 and a lower sub-chamber 703. In most embodiments, plasma grid 750 may be removed, thereby utilizing a chamber space made of sub-chambers 702 and 703. A chuck 717 is positioned within the lower sub-chamber 703 near the bottom inner surface. The chuck 717 is configured to receive and hold a semiconductor substrate or wafer 719 upon which the etching and deposition processes are performed. The chuck 717 can be an electrostatic chuck for supporting the wafer 719 when present. In some embodiments, an edge ring (not shown) surrounds chuck 717, and has an upper surface that is approximately planar with a top surface of the wafer 719, when present over chuck 717. The chuck 717 also includes electrostatic electrodes for chucking and dechucking the wafer 719. A filter and DC clamp power supply (not shown) may be provided for this purpose. Other control systems for lifting the wafer 719 off the chuck 717 can also be provided. The chuck 717 can be electrically charged using an RF power supply 723. The RF power supply 723 is connected to matching circuitry 721 through a connection 727. The matching circuitry 721 is connected to the chuck 717 through a connection 725. In this manner, the RF power supply 723 is connected to the chuck 717.

Elements for plasma generation include a coil 733 is positioned above window 711. In some embodiments, a coil is not used in disclosed embodiments. The coil 733 is fabricated from an electrically conductive material and includes at least one complete turn. The example of a coil 733 shown in FIG. 7 includes three turns. The cross-sections of coil 733 are shown with symbols, and coils having an "X" extend rotationally into the page, while coils having a "●" extend rotationally out of the page. Elements for plasma generation also include an RF power supply 741 configured to supply RF power to the coil 733. In general, the RF power supply 741 is connected to matching circuitry 739 through a connection 745. The matching circuitry 739 is connected to the coil 733 through a connection 743. In this manner, the RF power supply 741 is connected to the coil 733. An optional Faraday shield 749 is positioned between the coil 733 and the window 711. The Faraday shield 749 is maintained in a spaced apart relationship relative to the coil 733. The Faraday shield 749 is disposed immediately above the window 711. The coil 733, the Faraday shield 749, and the window 711 are each configured to be substantially parallel to one another. The Faraday shield 749 may prevent metal or other species from depositing on the window 711 of the process chamber 724.

Process gases (e.g., carrier gases, halogen-containing gases, argon, etc.) may be flowed into the process chamber through one or more main gas flow inlets 760 positioned in the upper sub-chamber 702 and/or through one or more side gas flow inlets 770. Likewise, though not explicitly shown, similar gas flow inlets may be used to supply process gases to a capacitively coupled plasma processing chamber. A vacuum pump 740, e.g., a one or two stage mechanical dry pump and/or turbomolecular pump, may be used to draw process gases out of the process chamber 724 and to maintain a pressure within the process chamber 724. For example, the vacuum pump 740 may be used to evacuate the lower sub-chamber 703 during a purge operation of ALE. A valve-controlled conduit may be used to fluidically connect the vacuum pump to the process chamber 724 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 700, one or more process gases may be supplied through the gas flow inlets 760 and/or 770. In certain embodiments, process gas may be supplied only through the main gas flow inlet 760, or only through the side gas flow inlet 770. In some cases, the gas flow inlets shown in the figure may be replaced by more complex gas flow inlets, one or more showerheads, for example. The Faraday shield 749 and/or optional grid 750 may include internal channels and holes that allow delivery of process gases to the process chamber 724. Either or both of Faraday shield 749 and optional grid 750 may serve as a showerhead for delivery of process gases. In some embodiments, a liquid vaporization and delivery system may be situated upstream of the process chamber 724, such that once a liquid reactant or precursor is vaporized, the vaporized reactant or precursor is introduced into the process chamber 724 via a gas flow inlet 760 and/or 770.

Radio frequency power is supplied from the RF power supply 741 to the coil 733 to cause an RF current to flow through the coil 733. The RF current flowing through the coil 733 generates an electromagnetic field about the coil 733. The electromagnetic field generates an inductive current within the upper sub-chamber 702. The physical and chemical interactions of various generated ions and radicals with the wafer 719 etch features of and deposit layers on the wafer 719.

Volatile etching and/or deposition byproducts may be removed from the lower sub-chamber 703 through port 722. The chuck 717 disclosed herein may operate at elevated temperatures ranging between about 10° C. and about 250° C. The temperature will depend on the process operation and specific recipe.

Apparatus 700 may be coupled to facilities (not shown) when installed in a clean room or a fabrication facility. Facilities include plumbing that provide processing gases, vacuum, temperature control, and environmental particle control. These facilities are coupled to apparatus 700, when installed in the target fabrication facility. Additionally, apparatus 700 may be coupled to a transfer chamber that allows robotics to transfer semiconductor wafers into and out of apparatus 700 using typical automation.

In some embodiments, a system controller 730 (which may include one or more physical or logical controllers) controls some or all of the operations of a process chamber 724. The system controller 730 may include one or more memory devices and one or more processors. For example, the memory may include instructions to alternate between flows of modification chemistry such as a chlorine-containing modification chemistry and a removal gas such as argon, or instructions to ignite a plasma or apply a bias. For example, the memory may include instructions to set the bias at a power between about 0V and about 200V during some operations. In some embodiments, the apparatus 700 includes a switching system for controlling flow rates and durations when disclosed embodiments are performed. In some embodiments, the apparatus 700 may have a switching time of up to about 500 ms, or up to about 750 ms. Switching time may depend on the flow chemistry, recipe chosen, reactor architecture, and other factors.

In some embodiments, disclosed embodiments can be integrated on a MSSD (Multi-Station-Sequential-Deposition) chamber architecture in which one of deposition stations can be replaced by an ALE station to allow an integrated deposition/etch/deposition process using a similar chemistry for better fill and faster throughput capability.

In some implementations, the system controller 730 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 730, which may control various components or subparts of the system or systems. The system controller 730, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 730 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 730, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 730 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 730 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems and apparatus of the present embodiments. Accordingly, the present embodiments are to be considered as illustrative and not restrictive, and the embodiments are not to be limited to the details given herein.

The invention claimed is:

1. A method comprising:
   (a) exposing a surface of a metal on a substrate to a halide chemistry to form a modified halide-containing surface layer, the metal being selected from the group consisting of tungsten (W) and cobalt (Co); and
   (b) applying a bias voltage to the substrate while exposing the modified halide-containing surface layer to a plasma to thereby remove the modified halide-containing surface layer.

2. The method of claim 1, wherein the plasma is an argon plasma and the bias voltage in (b) is between about 50 Vb and 80 Vb.

3. The method of claim 1, wherein (a) comprises exposing the surface of the metal to a plasma.

4. The method of claim 3, wherein a bias is applied to the substrate during (a).

5. The method of claim 3, wherein the bias voltage during (a) is equal to or less than 100 Vb.

6. The method of claim 3, wherein the bias voltage during (a) is equal to or less than 50 Vb.

7. The method of claim 1, wherein the metal is tungsten (W).

8. The method of claim 7, wherein (a) comprises exposing the surface of the metal to a chlorine-containing plasma.

9. The method of claim 8, wherein the substrate temperature during (a) is less than 150° C.

10. The method of claim 8, wherein the chlorine-containing plasma is generated from a $Cl_2/BCl_3$ mixture.

11. The method of claim 10, wherein the $Cl_2/BCl_3$ mixture is between 0.5% and 10% (volumetric) $BCl_3$.

12. The method of claim 1, wherein the metal is cobalt (Co).

13. The method of claim 1, wherein (a) is performed without etching the surface of the metal.

14. A method
   (a) exposing a tungsten surface on a substrate to a chlorine-containing plasma to form a tungsten-containing and chlorine-containing surface layer at substrate temperature less than 150° C.; and
   (b) applying a bias voltage to the substrate while exposing the tungsten-containing and chlorine-containing surface layer to ions generated from an inert gas plasma to thereby remove tungsten-containing and chlorine-containing surface layer.

15. The method of claim 14, wherein the chlorine-containing plasma is generated from a $Cl_2/BCl_3$ mixture.

16. The method of claim 15, wherein the $Cl_2/BCl_3$ mixture is between 0.5% and 10% (volumetric) $BCl_3$.

* * * * *